United States Patent
Chen

(10) Patent No.: US 10,510,426 B2
(45) Date of Patent: Dec. 17, 2019

(54) PROGRAMMING METHOD, PROGRAMMING APPARATUS AND STORAGE MEDIUM FOR NON-VOLATILE MEMORY

(71) Applicants: GIGADEVICE SEMICONDUCTOR (SHANGHAI) INC., Shanghai (CN); GIGADEVICE SEMICONDUCTOR (BEIJING) INC., Beijing (CN); GIGADEVICE SEMICONDUCTOR (HEFEI) INC., Hefei (CN)

(72) Inventor: Minyi Chen, Wan Chai (CN)

(73) Assignees: GIGADEVICE SEMICONDUCTOR (SHANGHAI) INC., Shanghai (CN); GIGADEVICE SEMICONDUCTOR (BEIJING) INC., Beijing (CN); GIGADEVICE SEMICONDUCTOR (HEFEI) INC., Hefei (CN)

( * ) Notice: Subject to any disclaimer, the term of this patent is extended or adjusted under 35 U.S.C. 154(b) by 0 days.

(21) Appl. No.: 15/964,929

(22) Filed: Apr. 27, 2018

(65) Prior Publication Data

US 2019/0333591 A1  Oct. 31, 2019

(51) Int. Cl.
*G11C 16/04* (2006.01)
*G11C 16/34* (2006.01)
*G11C 16/10* (2006.01)
*G11C 16/30* (2006.01)
(Continued)

(52) U.S. Cl.
CPC .......... *G11C 16/3459* (2013.01); *G11C 16/10* (2013.01); *G11C 16/26* (2013.01); *G11C 16/30* (2013.01); *G11C 16/0408* (2013.01); *G11C 2216/14* (2013.01); *H01L 29/7883* (2013.01)

(58) Field of Classification Search
CPC ..... G11C 16/3459; G11C 16/10; G11C 16/26; G11C 16/30; G11C 16/0408; G11C 2216/14

See application file for complete search history.

(56) References Cited

U.S. PATENT DOCUMENTS

| | | | | |
|---|---|---|---|---|
| 6,064,607 A | * | 5/2000 | Miki | G11C 8/10 365/200 |
| 6,330,186 B2 | * | 12/2001 | Tanaka | G11C 16/10 365/185.11 |

(Continued)

*Primary Examiner* — Pho M Luu
(74) *Attorney, Agent, or Firm* — Thomas|Horstemeyer, LLP

(57) ABSTRACT

Provided are a programming method, programming apparatus and storage medium to reduce threshold voltage distribution in a non-volatile memory. The method includes performing program loops on a target page by sequentially using first programming voltages Vn; and when a predetermined condition is reached, proceeding to perform program loops on the target page by sequentially using second programming voltages Um until the target page is successfully programmed. $Vn=V1+(n-1)\times d1$, where n denotes a program loop count of the first programming voltages, n is an integer greater than or equal to 1, and V1 and d1 are all positive numbers. $Um=Vn+(m-1)\times d2$, where m denotes a program loop count of the second programming voltages, m is an integer greater than or equal to 2, and d2 is a positive number not equal to d1.

19 Claims, 6 Drawing Sheets

(51) Int. Cl.
    *G11C 16/26*     (2006.01)
    *H01L 29/788*     (2006.01)

(56) References Cited

U.S. PATENT DOCUMENTS 9,672,149 B2 * 6/2017 Park .................... G11C 16/12
2010/0257308 A1 * 10/2010 Hsu .................... G06F 12/0246
                                                                   711/103

* cited by examiner

PROGRAMMING METHOD, PROGRAMMING APPARATUS AND STORAGE MEDIUM FOR NON-VOLATILE MEMORY

TECHNICAL FIELD

Embodiments of the present disclosure relate to memory technologies and, for example, relate to a programming method, programming apparatus and storage medium for a non-volatile memory.

BACKGROUND

Non-volatile flash memory (such as NAND flash memory) is a common memory chip. Data stored in the NAND flash memory will not be lost if the power is turned off and is electrically erasable and writable in a system. The NAND flash memory has the advantages of a large capacity and a fast rewriting speed and is suitable for storage of a large amount of data. The NAND flash memory has become the mainstream of the market due to a high integration level and a low cost.

FIG. 1 is a schematic diagram of a common NAND flash memory including a memory cell array 11, a word line selection unit 12, a bit line selection unit 13, a charge pump 14 and a control unit 15. The memory cell array 11 is an array of memory cells which are arranged along the word lines and bit lines. Specifically, the memory cell array 11 is composed of multiple blocks, each block is composed of multiple pages, and each page is composed of memory cells connected by word lines and bit lines. Operations on memory cells generally include: an erase operation, a program (write) operation and a read operation. The erase operation is performed in blocks. The program operation and the read operation are performed in pages. For example, when a program operation is performed on memory cells, the control unit 15 selects a specific programming page through the word line selection unit 12 and the bit line selection unit 13, and controls the charge pump 14 to apply a programming voltage to corresponding memory cells.

If the programming voltage applied to the memory cells is too low, a programming speed is low, and programming succeeds after multiple program operations, affecting a lifespan of a flash memory chip. If the programming voltage applied to the memory cells is too high, a threshold voltage of the memory cells will be raised too much, resulting in difficulty in later erase operations. Thus, how to improve programming performance has been what those skilled in the art are trying to find out.

SUMMARY

The following is a summary of a subject matter described herein in detail. This summary is not intended to limit the scope of the claims.

Embodiments of the present disclosure provide a programming method, programming apparatus and storage medium for a memory cell. The programming method can reduce programming stress and improve programming performance.

In one aspect, embodiments of the present disclosure provide a programming method for a memory cell.

The method includes performing program loops on a target page by sequentially using first programming voltages $Vn$; and when a predetermined condition is reached, proceeding to perform program loops on the target page by sequentially using second programming voltages $Um$ until the target page is successfully programmed, $Vn=V1+(n-1)\times d1$, where n denotes a program loop count of the first programming voltages, n is an integer greater than or equal to 1, and $V1$ and $d1$ are all positive numbers; and $Um=Vn+(m-1)\times d2$, where m denotes a program loop count of the second programming voltages, m is an integer greater than or equal to 2, and $d2$ is a positive number not equal to $d1$.

In a second aspect, embodiments of the present disclosure further provide a programming apparatus for a memory cell.

The apparatus includes a first programming circuit configured to perform program loops on a target page by sequentially using first programming voltages $Vn$; and a second programming circuit configured to, when a predetermined condition is reached, proceed to perform program loops on the target page by sequentially using second programming voltages $Um$ until the target page is successfully programmed.

$Vn=V1+(n-1)\times d1$, where n denotes a program loop count of the first programming voltages, n is an integer greater than or equal to 1, and $V1$ and $d1$ are all positive numbers; and $Um=Vn+(m-1)\times d2$, where m denotes a program loop count of the second programming voltages, m is an integer greater than or equal to 2, and $d2$ is a positive number not equal to $d1$.

In a third aspect, embodiments of the present disclosure further provide a storage medium containing the programming apparatus described in the above second aspect.

In a fourth aspect, embodiments of the present disclosure further provide a storage medium containing computer-executable instructions that, when executed by a computer processor, implement the programming method for a memory cell described in the above first aspect.

The programming method for a memory cell provided by embodiments of the present disclosure changes a delta between programming voltages used in two adjacent program loops to reduce programming stress and improving programming performance.

BRIEF DESCRIPTION OF DRAWINGS

Other aspects can be understood after the accompanying drawings and detailed description are read and understood.

DETAILED DESCRIPTION

The present disclosure will be further described in detail with reference to the accompanying drawings and embodiments. It is to be understood that the embodiments set forth below are intended to illustrate and not to limit the present disclosure. It is to be noted that to facilitate description, only part, not all, of structures related to the present disclosure are illustrated in the accompanying drawings.

Figure 1:
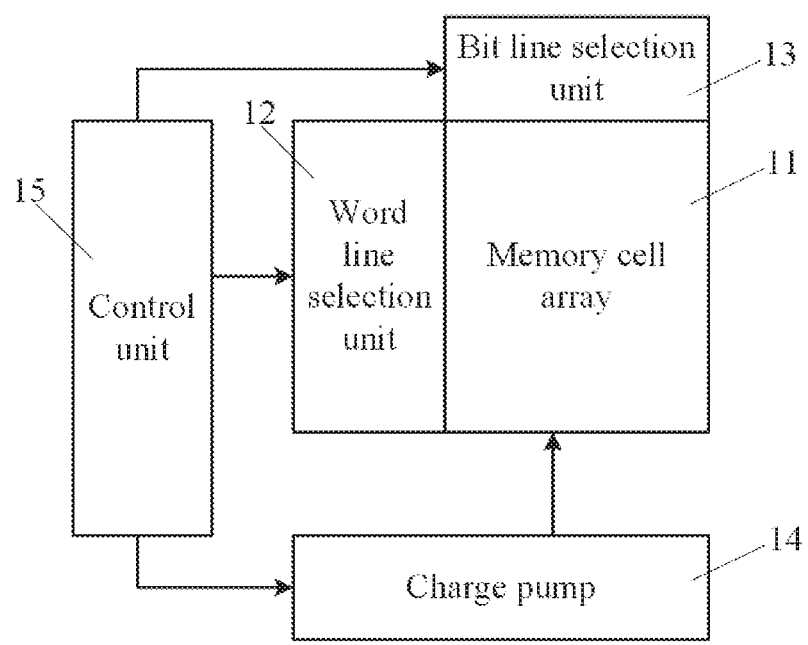
FIG. 1 is a simplified schematic diagram of an NAND flash memory in the related art.
Figure 2:
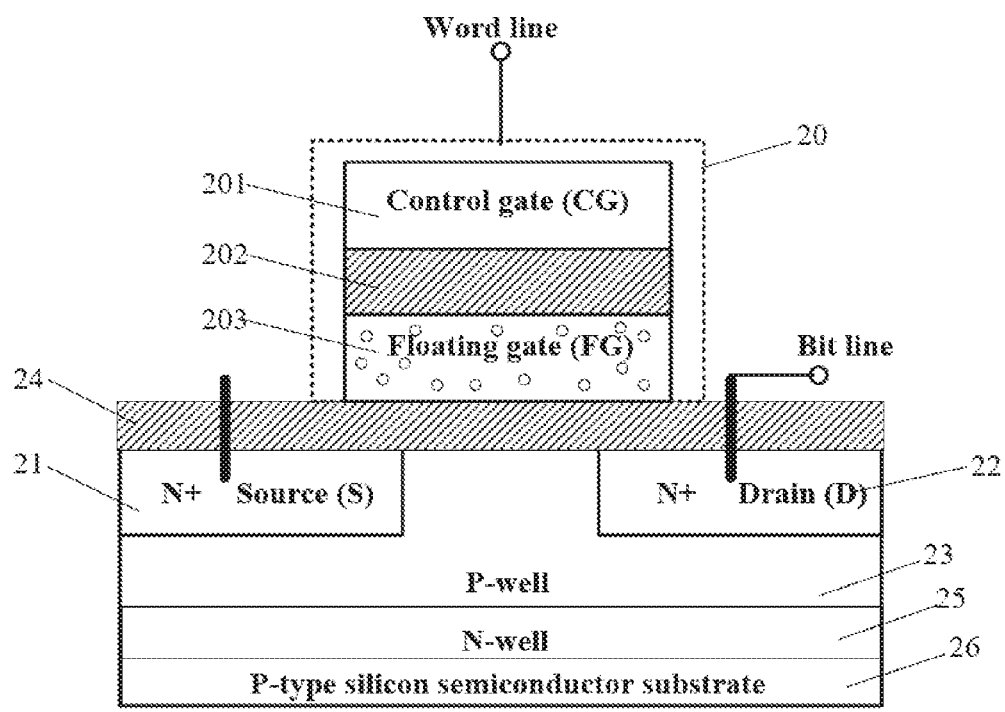
FIG. 2 is a schematic cross-sectional view of a Metal-Oxide-Semiconductor Field-Effect Transistor in an NAND flash memory.

In non-volatile flash memories, a memory cell includes a Metal-Oxide-Semiconductor Field-Effect Transistor (MOSFET). FIG. 2 is a diagram showing a structure of a common MOSFET. The MOSFET includes a gate 20, a source 21, a drain 22, a P-well 23, an N-well 25, a substrate 26 (in this embodiment, the substrate 26 is a P-type silicon semiconductor substrate) and a tunnel oxide layer 24. Two N-type regions are formed in the P-type silicon semiconductor substrate 26 by diffusion. The tunnel oxide layer 24 covers the P-well 23. Two holes are formed in the tunnel oxide layer 24 above the N-type regions by etching. Three electrodes, i.e., the gate 20, the source 21 and the drain 22, are formed on the oxide layer and in the two holes by metallization. The source 21 and the drain 22 correspond to the two N-type regions. The drain 22 is electrically connected to a bit line of the memory cell. Further, the gate 20 further includes a control gate 201, an inter-poly dielectric (IPD) 202 and a floating gate 203. The floating gate 203 is electrically connected to a word line of the memory cell. Charges may be trapped in the floating gate 203.

The memory cell stores information 0 or 1 by storing the charges in the floating gate 203. When a large amount of charges are trapped in the floating gate 203, the memory cell has a large threshold voltage and stores information 0. When a small amount of charges are trapped in the floating gate 203, the memory cell has a small threshold voltage and stores information 1. The purpose of performing a program operation on the memory cell is to raise the threshold voltage of the memory cell (i.e., increase the charges of the floating gate 203) so as to change the storage state of the memory cell to make the memory cell store information 0.

Figure 3:
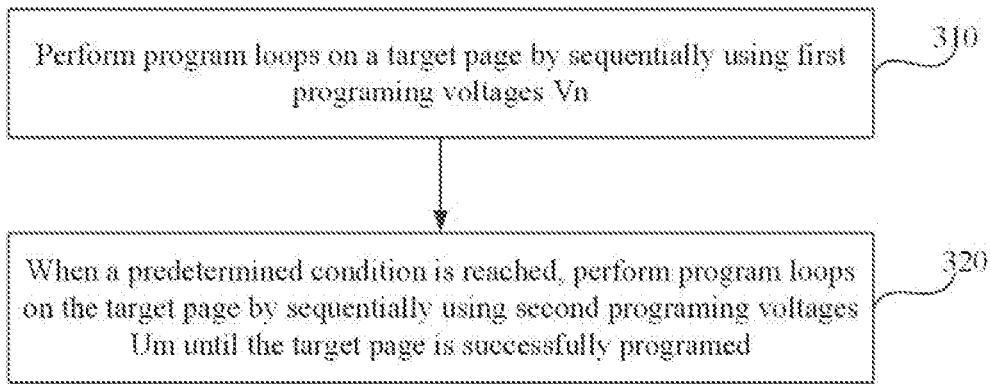
FIG. 3 is a flowchart of a programming method for a non-volatile memory according to embodiment 1 of the present disclosure.

To solve the above related problem, FIG. 3 illustrates a flowchart of a programming method for a non-volatile memory according to an embodiment of the present disclosure. This embodiment may be implemented by a programming apparatus. The apparatus may be implemented by software and/or hardware and may be integrated into a flash memory chip. As shown in FIG. 3, the programming method for a non-volatile memory provided in this embodiment includes the steps described below.

In step 310, program loops are performed on a target page by sequentially using first programming voltages Vn.

The program loops are performed to write information 0 into the memory cells in the target page.

Performing the program loop on the target page may include: applying a programming voltage to a word line of the memory cell in the target page by using a charge pump. Since the programming voltage applied to the word line of the memory cell in the target page just needs to last for microseconds for program, usually the charge pump is used to apply the programming voltage.

Figure 4:
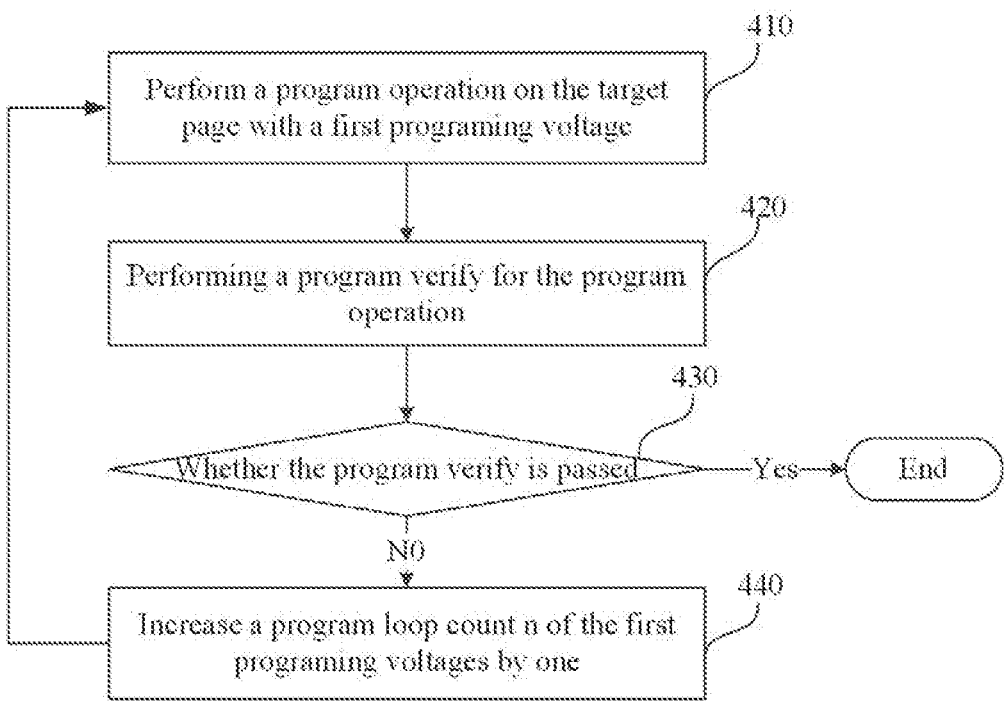
FIG. 4 is a flowchart of performing program loops on a target page using first programming voltages according to an embodiment of the present disclosure.

Referring to FIG. 4, which is a flowchart of performing program loops on a target page by sequentially using first programming voltages Vn. The step of performing program loops on a target page by sequentially using first programming voltages Vn includes the steps described below.

In step 410, a program operation is performed on the target page by using the first programming voltage Vn.

In step 420, a programming verification is performed for this program operation.

In step 430, it is determined whether the programming verification is passed; if the programming verification is not passed, the programming method goes to step 440; and if the programming verification is passed, the programming method is ended.

In step 440, a program loop count n of the first programming voltages is increased by one and the programming method returns to step 410.

The first programming voltage $Vn=V1+(n-1)\times d1$, where n denotes the program loop count of the first programming voltages, n is an integer greater than or equal to 1, and V1 and d1 are all positive numbers. That is, the first programming voltage Vn is an arithmetic progression whose initial term and delta may be set by parameters. In one embodiment, the first programming voltage V1 is 15 V and the delta d1 is 1 V. It is to be understood by those skilled in the art that values of the first programming voltage V1 and the delta d1 may be set according to the actual situation. As example values, 15 V and 1 V are not intended to limit the first programming voltage V1 and the delta d1. In one embodiment, the initial value V1 of the first programming voltage Vn is 13 V. Assuming that the delta d1 is 1 V, then the step of performing programming loops on the target page by sequentially using first programming voltages Vn includes the steps described below.

For the first time, the program operation is performed on the target page by using a first programming voltage V1 of 13 V, and then programming verification is performed for this program operation. If the programming verification is not passed, then the program loop count n of the first programming voltage is increased by one. For the second time, the program operation is performed on the target page by using a first programming voltage V2 of 14 V, and then programming verification is performed for this program operation. If the programming verification is not passed, then the program loop count n of the first programming voltage is increased by one. For the third time, the program operation is performed on the target page by using a first programming voltage V3 of 15 V The rest are done in the same manner.

In one embodiment, the step of performing programming verification includes the steps described below.

A read operation is performed on the memory cells in the target page.

If the result of the read operation is 0, it is determined that this program operation succeeds. If the result of the read operation is 1, it is determined that this program operation fails. In one embodiment, the charge pump may be used to apply corresponding reading voltages to a word line and a bit line of the memory cells in the target page, and a current on the bit line may be inputted to an input terminal of a sense amplifier; and the current on the bit line is compared with a reference current of the sense amplifier so as to determine the result of the read operation.

In step 320, when a predetermined condition is reached, program loops are performed on the target page by sequentially using second programming voltages Um until the target page is successfully programmed.

In one embodiment, if most memory cells in the target page have been programmed successfully and only some memory cells in the target page are not programmed successfully after multiple program loops with the first programming voltages Vn on the target page, then a delta between programming voltages used in two adjacent program loops is changed, i.e., the second programming voltages Um are used sequentially to proceed the program loops on the target page, until the target page is successfully programmed. Um=Vn+(m−1)×d2, where m denotes a program loop count of the second programming voltages, m is an integer greater than or equal to 2, and d2 is a positive number not equal to d1. That is, the last one Vn of the first programming voltage plus the delta d2 is used as the first one of the second programming voltages. The delta between programming voltages used in two adjacent program loops is changed such that the programming voltage is gradually increased, preventing threshold voltage of the memory cell from being raised to an over high level by a high programming voltage, thereby reducing programming stress and improving programming performance.

In one embodiment, the step of performing program loops on the target page by sequentially using the second programming voltages Um includes the steps described below.

A program operation is performed on the target page by using the second programming voltage.

A programming verification is performed for this program operation.

If the programming verification is not passed, the program loop count m of the second programming voltages is increased by one and the programming method returns to the step of performing the program operation on the target page using the second programming voltage Um.

If the programming verification is passed, the programming method is ended.

The initial value of the program loop count m of the second programming voltages is 2. That is, the last one Vn of the first programming voltages plus the delta d2 is used as the initial one U2 of the second programming voltages starting from 2.

Figure 5:
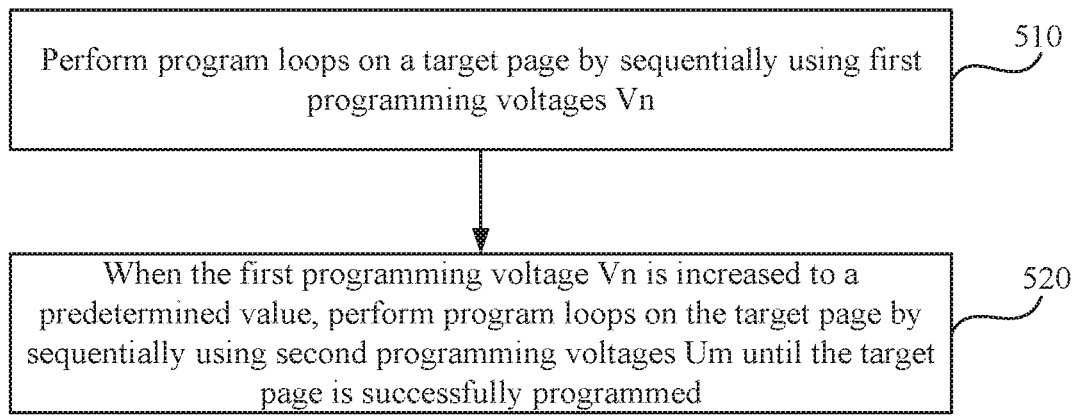
FIG. 5 is a flowchart of another programming method for a non-volatile memory according to an embodiment of the present disclosure.

Referring to FIG. 5, which is a flowchart of another programming method for a non-volatile memory. In one or more embodiments, the predetermined condition includes that the first programming voltage Vn is increased to a predetermined value. The predetermined value for the first programming voltage Vn may be set by a parameter. For example, the predetermined value may be 18 V. If memory cells that fail to be programmed still exist, the second programming voltages Um are used sequentially to continue the program loops on the target page.

In one or more embodiment, the predetermined value may be set through a comparison parameter table for the first programming voltage Vn as shown in Table 1. In Table 1, the first to the fourth columns [3][2][1][0] represent corresponding bits of a register and the fifth column represents values of programming voltages applied to the word line of the memory cell. In the process of performing program loops on the target page by sequentially using first programming voltages Vn, a comparison circuit in the flash memory chip compares the current first programming voltage Vn with the predetermined value in Table 1. When the first programming voltage Vn reaches the predetermined value (e.g., 18 V) in Table 1, the second programming voltage Um is used to perform the program loops on the target page.

TABLE 1

| Comparison parameter table for first programming voltage Vn | | | | |
| --- | --- | --- | --- | --- |
| [3] | [2] | [1] | [0] | Programming Pulse Voltage (V) |
| 0 | 0 | 0 | 0 | 15 |
| 0 | 0 | 0 | 1 | 16 |
| 0 | 0 | 1 | 0 | 17 |
| 0 | 0 | 1 | 1 | 18 |
| 0 | 1 | 0 | 0 | 19 |
| 0 | 1 | 0 | 1 | 20 |
| 0 | 1 | 1 | 0 | 21 |
| 0 | 1 | 1 | 1 | 22 |
| 1 | 0 | 0 | 0 | 23 |
| 1 | 0 | 0 | 1 | 24 |
| 1 | 0 | 1 | 0 | 25 |
| 1 | 0 | 1 | 1 | 26 |
| 1 | 1 | 0 | 0 | 27 |
| 1 | 1 | 0 | 1 | 28 |
| 1 | 1 | 1 | 0 | 29 |
| 1 | 1 | 1 | 1 | 30 |

In one or more embodiments, the above step 320 is described below by using an example in which the predetermined condition is that the first programming voltage Vn is increased to the predetermined value, the predetermined value is 20 V, the initial programming voltage is 13 V, d1=1 V and d2=0.5 V.

For the first time, the program operation is performed on the target page with a first programming voltage V1 of 13 V, and then programming verification is performed for this program operation. If the programming verification is not passed, then the program loop count n of the first programming voltage is increased by one. For the second time, the program operation is performed on the target page with a first programming voltage V2 of 14 V, and then programming verification is performed for this program operation. If the programming verification is not passed, then the program loop count n of the first programming voltage is increased by one. For the third time, the program operation is performed on the target page with a first programming voltage V3 of 15V. The rest are done in the same manner until the first programming voltage Vn reaches the predetermined value of 20 V. If the target page is still not successfully programmed, the second programming voltage Um is used to perform the program loops on the target page, i.e., a second programming voltage U2 of 20.5 V, instead of a first programming voltage of 21 V, is used to perform the program operation on the target page. If programming still fails, a second programming voltage U3 of 21 V is used to perform the program operation on the target page. The rest are done in the same manner until the target page is successfully programmed. That is, starting from the programming voltage of 20 V, the delta between programming voltages used in two adjacent program operations is changed from 1 V to 0.5 V. This allows memory cells that fail to be programmed to be gradually programmed successfully, reducing programming stress while preventing the threshold voltage of the memory cells from being raised too much.

In one or more embodiment, 15 V≤the programming voltage Vn (Um)≤30 V.

It is to be noted that deltas d1 and d2 and the predetermined value may all be set by parameters. This embodiment just gives examples of the deltas d1 and d2 and does not limit the deltas d1 and d2. For details, see Table 2, a parameter table for a delta between programming voltages used in two adjacent program loops. It is feasible to set corresponding bits of the register to set the value of d1 or d2. In an alternative embodiment, the deltas d1 and d2 are set using different delta parameter tables. In another alternative embodiment, the deltas d1 and d2 are set using the same delta parameter table. In yet another alternative embodiment, the difference between d1 and d2 is set using a difference parameter table.

TABLE 2

Parameter table for a delta between programming voltages used in two adjacent program operations

| [3] | [2] | [1] | [0] | Delta Programming Voltage (V) |
|---|---|---|---|---|
| 0 | 0 | 0 | 0 | 0.1 |
| 0 | 0 | 0 | 1 | 0.2 |
| 0 | 0 | 1 | 0 | 0.3 |
| 0 | 0 | 1 | 1 | 0.4 |
| 0 | 1 | 0 | 0 | 0.5 |
| 0 | 1 | 0 | 1 | 0.6 |
| 0 | 1 | 1 | 0 | 0.7 |
| 0 | 1 | 1 | 1 | 0.8 |
| 1 | 0 | 0 | 0 | 0.9 |
| 1 | 0 | 0 | 1 | 1.0 |
| 1 | 0 | 1 | 0 | 1.1 |
| 1 | 0 | 1 | 1 | 1.2 |
| 1 | 1 | 0 | 0 | 1.3 |
| 1 | 1 | 0 | 1 | 1.4 |
| 1 | 1 | 1 | 0 | 1.5 |
| 1 | 1 | 1 | 1 | 1.6 |

Figure 6:
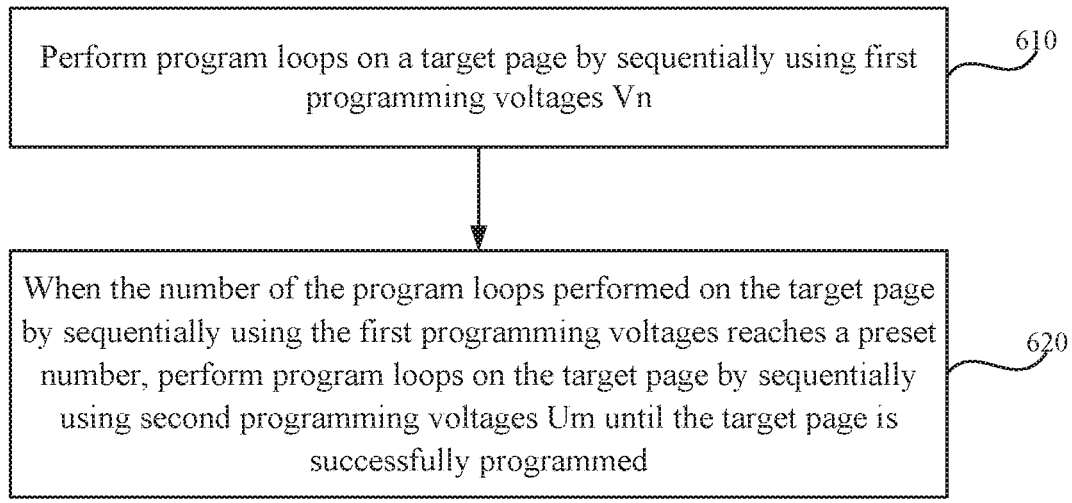
FIG. 6 is a flowchart of yet another programming method for a non-volatile memory according to an embodiment of the present disclosure.

Referring to FIG. 6, which is a flowchart of yet another programming method for a non-volatile memory. In one or more embodiments, the predetermined condition includes that the number of the program loops performed on the target page by sequentially using the first programming voltages Vn reaches a preset number. That is, the program loop count for the first programming voltages reaches a preset number.

The preset number may be set by a parameter. For example, if the preset number is 4, four program loops with the first programming voltages Vn are performed on the target page. If memory cells that fail to be programmed still exist, then starting from the fifth program loop, the delta between programming voltages used in two adjacent program loops starts to be changed and the second programming voltage Um starts to be used to continue the program operations on the target memory. That is, the programming voltage used in the fifth program operation is greater than the programming voltage used in the fourth program operation by d2, and the programming voltage used in the fourth program operation is greater than a programming voltage used in the third program operation by d1. In an alternative embodiment, d1 is greater than d2. In another alternative embodiment, d1 is smaller than d2. d1 and d2 may be set by a parameter table.

For details, see Table 3, a parameter table for the program loop count. The preset number may be set by the parameter table for the program loop count.

TABLE 3

Parameter table for a program cycle count

| [2] | [1] | [0] | Program Loop Count |
|---|---|---|---|
| 0 | 0 | 0 | 1 |
| 0 | 0 | 1 | 2 |
| 0 | 1 | 0 | 3 |
| 0 | 1 | 1 | 4 |
| 1 | 0 | 0 | 5 |
| 1 | 0 | 1 | 6 |
| 1 | 1 | 0 | 7 |
| 1 | 1 | 1 | 8 |

Figure 7:
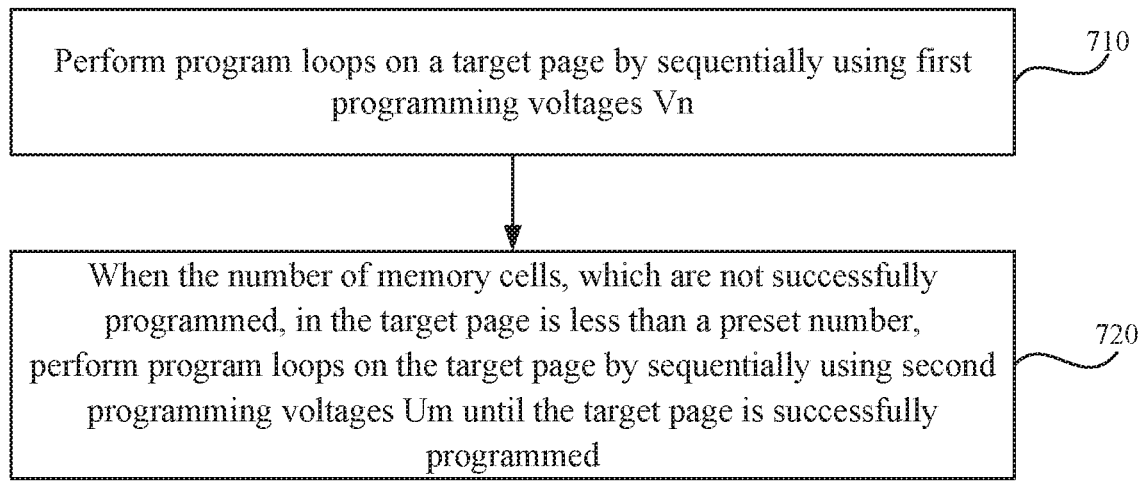
FIG. 7 is a flowchart of still another programming method for a non-volatile memory according to an embodiment of the present disclosure.

Referring to FIG. 7, which is a flowchart of still another programming method for a non-volatile memory. In one embodiment, the predetermined condition includes that the number of memory cells that have failed to be programmed in the target page is less than a preset number. When the number of the memory cells that have failed to be programmed (i.e., that have not passed programming verification) in the target page is less than the preset number, most memory cells have been programmed successfully. In this case, the memory cells that have failed to be programmed are programmed with programming voltages having a smaller delta (that is, incremental-step-pulses having a smaller step) such that the memory cells that have failed to be programmed are gradually programmed successfully, thus reducing programming stress and improving programming performance. The preset number may be, e.g., 15, and may be set by a parameter. As shown in Table 4, a parameter table for the number of memory cells that have failed to be programmed (i.e., that have not passed programming verification), the preset number may be set by corresponding bits of a register.

TABLE 4

Parameter table for the number of memory cells that have failed to be programmed (i.e., that have not passed programming verification)

| [1] | [0] | Not pass through verify bit counts (Bit) |
|---|---|---|
| 0 | 0 | 5 |
| 0 | 1 | 10 |
| 1 | 0 | 15 |
| 1 | 1 | 20 |

Figure 8:
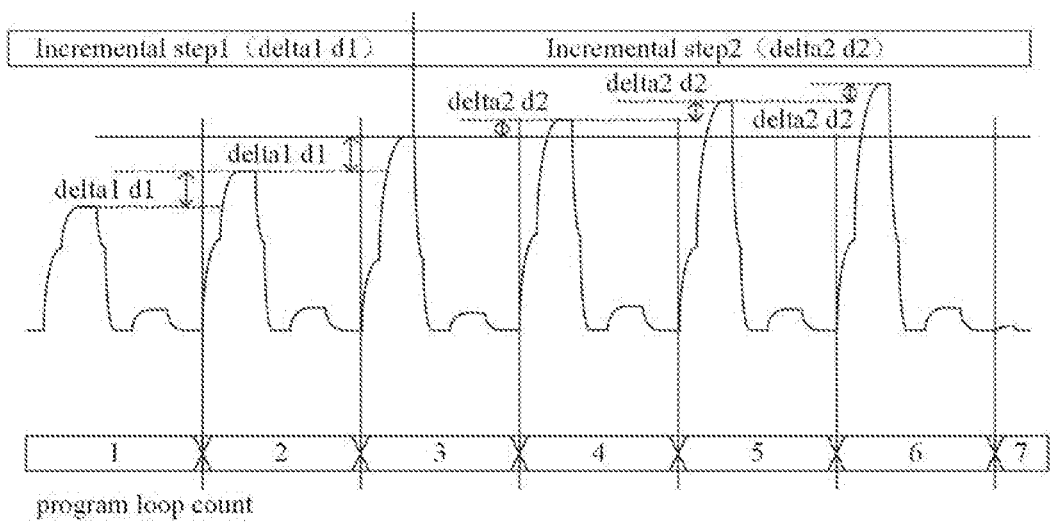
FIG. 8 is a schematic diagram illustrating a difference between programming voltages used in two adjacent program loops according to an embodiment of the present disclosure.
Figure 9:
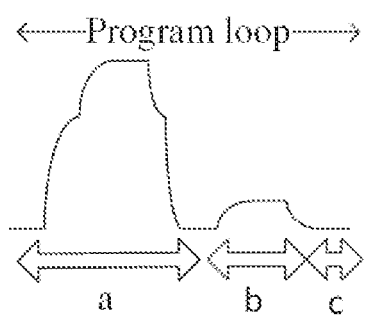
FIG. 9 is a flowchart of one programming loop according to an embodiment of the present disclosure.

In one or more embodiments, the differences (deltas) between programming voltages used in two adjacent loops are illustrated in FIG. 8. The predetermined condition for changing the delta includes that the number of the program loops performed on the target page by sequentially using the first programming voltages Vn reaches a preset number; or the first programming voltage Vn is increased to the predetermined value; or the number of memory cells that have failed to be programmed in the target page is less than a preset number. FIG. 9 shows one program loop. In FIG. 9, section "a" indicates a programming phase, section "b" indicates a programming verification phase and section "c" indicates a scan phase in which the result of the programming verification is fed back and recorded.

The programming method for a non-volatile memory provided by this embodiment changes the delta between programming voltages used in two adjacent program loops if memory cells that fail to be programmed still exist after several program loops are performed on the target page (that is, changes the step of the incremental-step-pulses for programming), thereby reducing programming stress and improving programming performance.

Figure 10:
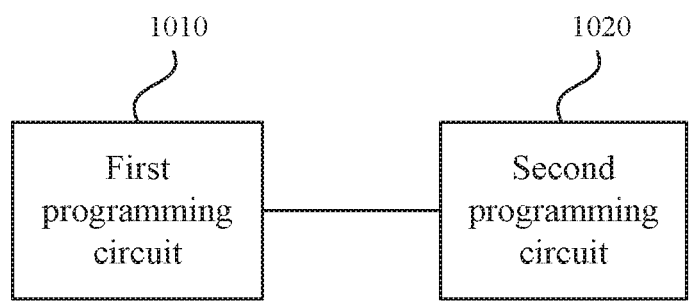
FIG. 10 is a structure diagram of a programming apparatus for a non-volatile memory according to an embodiment of the present disclosure.

FIG. 10 is a structure diagram of a programming apparatus for a non-volatile memory according to an embodiment of the present disclosure. The apparatus includes a first programming circuit 1010 and a second programming circuit 1020.

The first programming circuit 1010 is configured to perform program loops on a target page by sequentially using first programming voltages Vn. The second programming circuit 1020 is configured to, when a predetermined condition is reached, continue the program loops on the target memory cell page by sequentially using second programming voltages Um until the target page is successfully programmed. Vn=V1+(n−1)×d1, where n denotes a program loop count of the first programming voltages, n is an integer greater than or equal to 1, and V1 and d1 are all positive numbers. Um=Vn+(m−1)×d2, where m denotes a program loop count of the second programming voltages, m is an integer greater than or equal to 2, and d2 is a positive number not equal to d1.

In one embodiment, the first programming circuit 1010 includes: a first programming sub-circuit configured to to perform a program operation on the target page with the first programming voltage Vn; a verification circuit configured to perform a programming verification for the program operation, and if the programming verification is not passed, increase the program loop count n of the first programming voltage by one; a returning circuit configured to return to the step of performing the program operation on the target page with the first programming voltage Vn; and an ending circuit configured to, if the programming verification is passed, end the programming method.

In one or more embodiments, the predetermined condition includes that the number of the program loops performed on the target page with the first programming voltages Vn reaches a preset number; or the first programming voltage Vn is increased to a predetermined value; or the number of memory cells that have failed to be programmed in the target page is less than a preset number.

The programming method for a non-volatile memory provided by this embodiment changes the delta between programming voltages used in two adjacent program loops if memory cells that fail to be programmed still exist after several program loops are performed on a target page, thereby reducing programming stress and improving programming performance.

The above apparatus can execute the method provided by any embodiment of the present disclosure, and has functional modules and beneficial effects corresponding to the execution method.

An embodiment of the present disclosure provides a storage medium containing the programming apparatus described in the above embodiment.

An embodiment of the present disclosure provides a storage medium containing computer-executable instructions that, when executed by a computer processor, implement a programming method for a non-volatile memory. The method includes performing program loops on a target page by sequentially using first programming voltages Vn; and when a predetermined condition is reached, continue the program loops on the target memory cell page by sequentially using second programming voltages Um until the target page is successfully programmed.

Vn=V1+(n−1)×d1, where n denotes a program loop count of the first programming voltages, n is an integer greater than or equal to 1, and V1 and d1 are all positive numbers. Um=Vn+(m−1)×d2, where m denotes a program loop count of the second programming voltages, m is an integer greater than or equal to 1, and d2 is a positive number not equal to d1.

In the storage medium containing computer-executable instructions provided by embodiments of the present disclosure, the computer-executable instructions implement not only the above method operations but also related operations in the programming method for a non-volatile memory provided by any embodiment of the present disclosure.

Embodiments in this disclosure are described in a progressive manner. Each embodiment focuses on differences from other embodiments. The same or similar parts in the embodiments can be referred to by each other.

It is to be noted that the above are only embodiments of the present disclosure and the technical principles used therein. It is to be understood by those skilled in the art that the present disclosure is not limited to the embodiments described herein.

What is claimed is:

1. A programming method for a non-volatile memory, comprising:
   performing program loops on a target page by sequentially using first programming voltages Vn; and
   when a predetermined condition is reached, proceeding to perform program loops on the target page by sequentially using second programming voltages Um until the target page is successfully programmed, wherein
   Vn=V1+(n−1)×d1, wherein n denotes a program loop count of the first programming voltages, n is an integer greater than or equal to 1, and V1 and d1 are all positive numbers; and
   Um=Vn+(m−1)×d2, wherein m denotes a program loop count of the second programming voltages, m is an integer greater than or equal to 2, and d2 is a positive number not equal to d1.

2. The programming method of claim 1, wherein the performing program loops on a target page by sequentially using first programming voltages Vn comprises:
   performing a program operation on the target page with a respective one of the first programming voltages;
   performing a programming verification for the program operation;
   if the programming verification is not passed, increasing the program loop count n of the first programming voltages by one and returning to the step of performing a program operation on the target page with a respective one of the first programming voltages; and
   if the programming verification is passed, ending the programming method.

3. The programming method of claim 2, wherein the predetermined condition is that a number of the program loops performed on the target page by sequentially using the first programming voltages Vn reaches a preset number.

4. The programming method of claim 2, wherein the predetermined condition is that one of the first programming voltages Vn is increased to a predetermined value.

5. The programming method of claim 2, wherein the predetermined condition is that a number of memory cells that have failed to be programmed in the target page is less than a preset number.

6. The programming method of claim 2, wherein the proceeding to perform program loops on the target page by sequentially using second programming voltages Um comprises:

performing a program operation on the target page with a respective one of the second programming voltages;

performing a programming verification for the program operation;

if the programming verification is not passed, increasing the program loop count m of the second programming voltages by one and returning to the step of using the second programming voltage Um to perform the program operation on the target memory cell page; and if the programming verification is passed, ending the programming method, wherein an initial value of the program loop count m of the second programming voltages is 2.

7. The programming method of claim 2, wherein performing a program operation on the target page comprises: applying, by a charge pump, a respective one of the first programming voltages Vn or a respective one of the second programming voltages Um to a word line of a memory cell in the target page.

8. The programming method of claim 5, wherein the performing the programming verification for the program operation comprises:

performing a read operation on the memory cells in the target page; and if a result of the reading operation is 0, determining that the program operation succeeds, and if the result of the reading operation is 1, determining that the program operation fails.

9. The programming method of claim 2, wherein the performing the programming verification for the program operation comprises:

performing a read operation on the memory cells in the target page; and if a result of the reading operation is 0, determining that the program operation succeeds, and if the result of the reading operation is 1, determining that the program operation fails.

10. The programming method of claim 1, wherein the predetermined condition is that a number of the program loops performed on the target page by sequentially using the first programming voltages Vn reaches a preset number.

11. The programming method of claim 1, wherein the predetermined condition is that one of the first programming voltages Vn is increased to a predetermined value.

12. The programming method of claim 1, wherein the predetermined condition is that a number of memory cells that have failed to be programmed in the target page is less than a preset number.

13. A programming apparatus for a non-volatile memory, comprising:

a first programming circuit configured to perform program loops on a target page by sequentially using first programming voltages Vn; and a second programming circuit configured to, when a predetermined condition is reached, proceed to perform program loops on the target page by sequentially using second programming voltages Um until the target page is successfully programmed, wherein $Vn=V1+(n-1)\times d1$, wherein n denotes a program loop count of the first programming voltages, n is an integer greater than or equal to 1, and V1 and d1 are all positive numbers; and $Um=Vn+(m-1)\times d2$, wherein m denotes a program loop count of the second programming voltages, m is an integer greater than or equal to 2, and d2 is a positive number not equal to d1, wherein the first programming circuit comprises:

a first programming sub-circuit configured to perform a program operation on the target page with a respective one of the first programming voltages, a verification circuit configured to perform a programming verification for the program operation, and if the programming verification is not passed, increase the program loop count n of the first programming voltages by one;

a returning circuit configured to return to a step of performing a program operation on the target page with a respective one of the first programming voltages; and an ending circuit configured to, if the programming verification is passed, ending a programming method.

14. The programming apparatus of claim 13, wherein the predetermined condition is that a number of the program loops performed on the target page by sequentially using the first programming voltages Vn reaches a preset number.

15. The programming apparatus of claim 13, wherein the predetermined condition is that one of the first programming voltages Vn is increased to a predetermined value.

16. The programming apparatus of claim 13, wherein the predetermined condition is that a number of memory cells that have failed to be programmed in the target page is less than a preset number.

17. A storage medium containing computer-executable instructions that, when executed by a computer processor, implement a programming method for a non-volatile memory, wherein the programming method comprises:

performing program loops on a target page by sequentially using first programming voltages Vn; and when a predetermined condition is reached, proceeding to perform program loops on the target page by sequentially using second programming voltages Um until the target page is successfully programmed, wherein $Vn=V1+(n-1)\times d1$, wherein n denotes a program loop count of the first programming voltages, n is an integer greater than or equal to 1, and V1 and d1 are all positive numbers; and $Um=Vn+(m-1)\times d2$, wherein m denotes a program loop count of the second programming voltages, m is an integer greater than or equal to 2, and d2 is a positive number not equal to d1.

18. The storage medium according to claim 17, wherein the predetermined condition is: a number of the program loops performed on the target page by sequentially using the first programming voltages Vn reaches a preset number, or one of the first programming voltages Vn is increased to a predetermined value.

19. The storage medium according to claim 17, wherein the predetermined condition is that a number of memory cells that have failed to be programmed in the target page is less than a preset number.

* * * * *